United States Patent [19]

Sakamoto et al.

[11] Patent Number: 4,552,688

[45] Date of Patent: Nov. 12, 1985

[54] ELECTROCONDUCTIVE SILICONE ELASTOMER COMPOSITIONS

[75] Inventors: Ryuji Sakamoto, Ohta; Taro Yamazaki, Yokohama, both of Japan

[73] Assignee: Toshiba Silicone Co., Ltd., Tokyo, Japan

[21] Appl. No.: 600,255

[22] Filed: Apr. 13, 1984

[30] Foreign Application Priority Data

Apr. 27, 1983 [JP] Japan .................. 58-74827

[51] Int. Cl.$^4$ ............................... H01B 1/06
[52] U.S. Cl. .................... 252/511; 524/495; 524/496; 523/137
[58] Field of Search ............ 252/502, 511; 524/495, 524/588, 496; 525/100; 428/403, 407; 523/137

[56] References Cited

U.S. PATENT DOCUMENTS

| | | | |
|---|---|---|---|
| 4,051,454 | 9/1977 | Lenser et al. | 252/511 |
| 4,145,317 | 3/1979 | Sado et al. | 252/511 |
| 4,273,697 | 6/1981 | Simimura et al. | 524/495 |
| 4,387,046 | 6/1983 | Mausch et al. | 252/511 |
| 4,433,096 | 2/1984 | Bokerman et al. | 524/495 |

Primary Examiner—Josephine L. Barr
Attorney, Agent, or Firm—Gary L. Loser

[57] ABSTRACT

The present invention provides an electroconductive silicone elastomer composition comprising:
(A) 100 parts by weight of a polydiorganosiloxane having an average degree of polymerization of 500 to 12,000, wherein each polymer molecule contains at least two vinyl groups bonded to silicon atoms;
(B) 100 to 500 parts by weight of nickel-coated carbon;
(C) 0.1 to 5 parts by weight of a polyorganohydrogensiloxane, and
(D) 0.2 to 300 ppm based on the total amount of (A), (B) and (C) of platinum metal or platinum compound as platinum atom.

8 Claims, 1 Drawing Figure

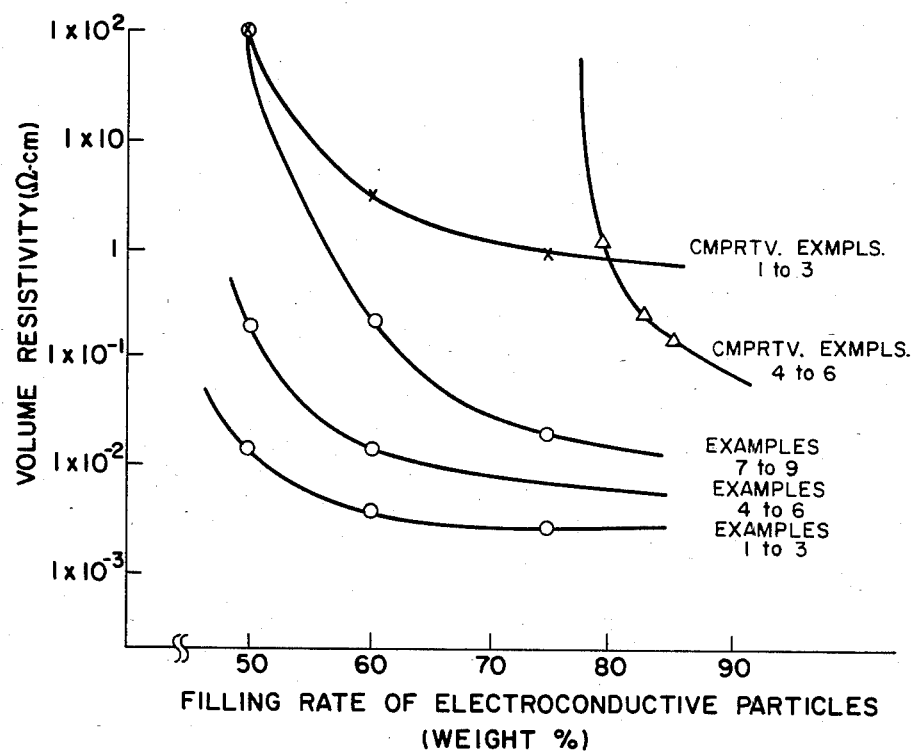

ELECTROCONDUCTIVE SILICONE ELASTOMER COMPOSITIONS

The present application claims priority of Japanese patent application serial number 83/74827, filed Apr. 27, 1983.

BACKGROUND OF THE INVENTION

The present invention relates to a heat resistant, electroconductive silicone elastomer composition. More particularly, the invention relates to a heat resistant, electroconductive silicone elastomer composition having reduced thermal oxidation caused generally when a metal powder is added to a silicone elastomer used as an electric contact material to reduce its resistivity.

An electroconductive silicone elastomer composition obtained by blending carbon powder to a silicone elastomer composition has been used as an electric contact material or electromagnetic wave shielding material.

Though the electroconductive silicone elastomer composition containing carbon powder is relatively stable thermally, its volume resistivity could not be reduced to lower than $1\Omega.cm$ and, therefore, it could not be used when a lower volume resistivity was required. Various processes have been proposed for obtaining an electroconductive silicone elastomer composition having a volume resistivity of $1\times10^{-2}$ to $10^{-3}\Omega.cm$ by mixing a silicone elastomer with various metal powders.

However, in these processes wherein the metal powder is used, the metal powder must be incorporated in the silicone elastomer in a large amount for obtaining an intended resistivity. Consequently, the physical properties of the silicone elastomer are damaged seriously. Another defect of these processes is that when the silicone elastomer composition is exposed to a high temperature, its resistivity is changed with time, since the resistivity is increased by the oxidation of the metal powder.

A method for overcoming these defects has been disclosed in the specification of Japanese Patent Publication No. 6223/1975 wherein an amine-containing or phosphorous-containing antioxidant is used. However, this method is ineffective for inhibiting the thermal oxidation at such a high temperature as employed when the silicone elastomer is used.

After intensive investigations made for the purpose of overcoming the defects of the prior art, the present inventors have found that an electroconductive silicone elastomer composition having a low resistivity, which is substantially unchanged with time even at a high temperature, and excellent moisture resistance, can be obtained by adding nickel-coated carbon to a silicone elastomer composition. The present application is based on this finding.

SUMMARY OF THE INVENTION

An object of the present invention is to provide an electroconductive silicone elastomer composition having a volume resistivity of $1\times10^{-1}$ to $1\times10^{-2}\Omega.cm$ which is substantially unchanged with time even at a high temperature and suitable for use as an electric contact material or electromagnetic wave shielding material.

In accordance with the present invention there is provided an electroconductive silicone elastomer composition comprising:

(A) 100 parts by weight of a polydiorganosiloxane having an average degree of polymerization of 500 to 12,000, wherein each polymer molecule contains at least two vinyl groups bonded to silicon atoms;

(B) 100 to 500 parts by weight of nickel-coated carbon used as electroconductive particles;

(C) 0.1 to 5 parts by weight of a polyorganohydrogensiloxane, and (D) 0.2 to 300 ppm based on the total amount of (A), (B), and (C) of platinum metal or platinum compound as platinum atom.

THE DRAWING

The drawing is a graph showing relationships between the filling rate of electroconductive particles and the volume resistivity.

DESCRIPTION OF THE INVENTION

The component (A) used as the base polymer for the electroconductive silicone elastomer composition of the present invention is a material normally used as a base polymer in silicone elastomer compositions. This material may be a polymer, copolymer, or a mixture thereof having one or more repeating diorganosiloxy units selected from the group consisting of dimethylsiloxy, phenylmethylsiloxy, diphenylsiloxy, methylvinylsiloxy, phenylvinylsiloxy, and the like. In order to obtain an elastomer by curing, it is necessary that each molecule of component (A) contain at least two vinyl groups bonded to silicon atoms. The end of the polydiorganosiloxane may be terminated by any of a triorganosiloxy, hydroxy and alkoxy group. The triorganosiloxy groups include, for example, trimethylsiloxy, dimethylvinylsiloxy, methylphenylvinylsiloxy, methyldiphenylsiloxy and analogs thereof.

The polydiorganosiloxane (A) has an average degree of polymerization of 500 to 12,000 preferably 1,000 to 5,000. When the average degee of polymerization is less than 500, the desired mechanical properties are not obtained, while when it exceeds 12,000, blending of the electroconductive particles becomes difficult.

The component (B) of the present invention is an important material essential for obtaining an electroconductive silicone elastomer composition having low resistivity, which is substantially unchanged with time even at high temperatures. The carbons to be coated with nickel include ordinary carbon black, artificial and natural graphite and granulated carbon having an average particle size of 10 to 100 μm, preferably 15 to 75 μm. When the average particle size is less than 10 μm, coating with nickel is difficult, while when it exceeds 100 μm, the mechanical strength of the electroconductive silicone elastomer is reduced.

The amount of nickel coating is 30 to 90 weight percent, preferably 50 to 70 weight percent, based on the carbon. When the amount of nickel coating is smaller than 30 weight percent no sufficient initial electroconductivity can be obtained, while when it exceeds 90 weight percent a change in the electroconductivity with time at a high temperature becomes remarkable.

The nickel coating may be effected by any ordinary chemical plating process, electrolysis process or carbonyl process. The carbonyl process is particularly preferred from the viewpoint of prevention of contamination with impurities.

The component (B) is used in an amount of 100 to 500 parts by weight, preferably 250 to 400 parts by weight, per 100 parts by weight of the component (A). When the amount of component (B) is smaller than 100 parts by weight, no sufficient initial electroconductivity can be obtained, while when it exceeds 500 parts by weight, blending of the electroconductive particles becomes difficult.

The polyorganohydrogensiloxane (C) used in the present invention acts as a crosslinking agent for component (A). To function as a crosslinking agent, component (C) must contain at least three hydrogen atoms bonded to silicon atoms, on average.

The organic groups bonded to the silicon atoms include the same organic groups as those bonded to the silicon atoms in polydiorganosiloxane (A). Though the average degree of polymerization of the polyorganohydrogensiloxane is not particularly limited, this polymer preferably comprises at least three siloxy units as a polymer in which two or more hydrogen atoms are bonded to one silicon atom cannot be prepared easily. The siloxane chain may be any of linear, cyclic or branched.

The amount of component (C) employed is 0.1 to 5 parts by weight per 100 parts by weight of the component (A). Preferably, the amount of component (C) is such that the number of the hydrogen atoms bonded to the silicon atoms in component (C) is 0.5 to 10, particularly 1.5 to 3, per vinyl group bonded to the silicon atoms in component (A). When the amount of component (C) is smaller than 0.1 part by weight or larger than 5 parts by weight, an elastomer having excellent physical properties cannot be obtained.

The component (D) used in the present invention acts as a catalyst for the addition reaction of components (A) and (C) to form the elastomer composition. Included within component (D) are platinum black, platinum black supported on a carrier, platinum tetrachloride, chloroplatinic acid and its alkali metal salts, alcohol-modified chloroplatinic acid, platinum/olefin complexes, platinum/vinylsiloxane complexes, platinum/phosphine complexes and platinum/phosphite complexes. From the viewpoint of solubility in component (A) or (C) and catalytic acitivity, the alcohol-modified platinic acid, platinum/olefin complexes and platinum/vinylsiloxane complexes are preferred.

The amount (in terms of platinum metal of component (D) is 0.2 to 300 ppm, preferably 1 to 100 ppm, based on the total amount of (A), (B) and (C). When the amount of component (D) is smaller than 0.2 ppm, the curing rate is insufficient and the cured product becomes sticky to make releasing difficult. When its amount exceeds 300 ppm, the curing rate becomes too high to realize a satisfactory processability and such a large amount is uneconomical.

The electroconductive silicone elastomer composition of the present invention is an addition cured type of silicone elastomer which is cured by the addition reaction of components (A) and (B) in the presence of the platinum compound catalyst (C) to form the elastomer composition. A silicone elastomer which is cured by a peroxide capable of forming a radical at around 170° C. in an extrusion molding cannot be used since its curing temperature is too high. Another silicone elastomer which is cured by a peroxide capable of forming a radical at around 120° C. cannot be used, since the vulcanization is inhibited by carbon.

In addition to the above-mentioned components, the composition of the present invention may contain an addition reaction inhibitor such as an acetylene compound, diallyl maleate, triallyl isocyanurate, a nitrile compound or an organic peroxide so as to prolong the curing time at room temperature.

Further, known reinforcing or unreinforcing silica fillers used for increasing mechanical strength of silicone elastomers in the prior art may also be added to the composition. These silicas include, for example, fumed silica, precipitated silica, calcined silica, silica aerogel, quartz powder and diatomaceous earth. These silica fillers may have an untreated surface or surface previously treated with an organosilicon compound such as organochlorosilane, polydiorganosiloxane or hexaorganodisilazane. Alternatively, the surface may be treated with the above-mentioned organosilicon compound in a kneading process. The surface treatment of the silica filler may be effected by any known processes.

The amount of the silica filler is generally smaller than 50 parts by weight per 100 parts by weight of the component (A). When the amount is larger than 50 parts by weight, blending of the electroconductive particles becomes difficult.

The composition may also contain cerium hydroxide which is generally used as an additive to improve thermal stability. An adequate cerium hydroxide powder has an average particle size of up to 50 $\mu$m and it used in an amount of 0.1 to 10 parts by weight per 100 parts by weight of component (A). If necessary, an agent for improving adhesion such as a polysiloxane in which the silicon atom is bonded to a side chain containing a trialkoxysilylalkyl group or an ester bond may be incorporated in the composition. Further, the composition may contain other thermal resistance promotors and additives such as antioxidants, processing aids, and flame retardants in desired amounts.

The above-mentioned components are kneaded together homogeneously by an ordinary means such as a roll mill or kneader mixer to obtain the electroconductive silicone elastomer composition of the present invention. If necessary a solvent may be added to the composition for facilitating the application operation. The solvent is evaporated after completion of the application. The thus obtained composition of the present invention is suitable for use as an electric contact material or electromagnetic wave shielding material.

In order that those skilled in the art may better understand the present invention, the following examples are provided by way of illustration and not by way of limitation.

EXAMPLES

EXAMPLES 1 TO 3

100 parts by weight of a polydimethylsiloxane terminated by vinyldimethylsiloxy units and an average degree of polymerization of 1,500, 6 parts by weight of a polymethylhydrogensiloxane comprising 40 molar percent of dimethylsiloxy units and 60 molar percent of methylhydrogensiloxy units and endblocked by trimethylsiloxy units. Six parts by weight of an organosilicon compound of the following formula and 0.05 part by weight of chloroplatinic acid/octene complex were mixed together to obtain a base compound:

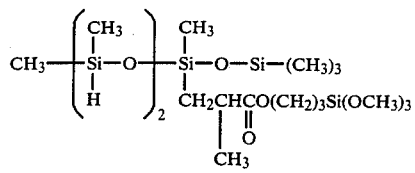

100 parts by weight of the base compound was mixed with electroconductive particles having an average particle size of 50 to 100 μm obtained by coating Artificial Graphite KS-44 (a product of Lonza, Ltd.) with 50 weight percent of nickel by chemical plating process in an amount shown in Table 1 to obtain an electroconductive silicone elastomer composition. The resulting composition was diluted with xylene to reduce its viscosity to a level suitable for screen printing. Thus, a pasty electroconductive silicone elastomer composition was obtained.

A 4 mm×40 mm pattern was printed by the pasty electroconductive silicone elastomer composition obtained as above (film thickness: about 100 μm). The printed composition was then cured by heating at 150° C. for one hour. The electroconductive properties of the resulting film are shown in Table 1.

COMPARATIVE EXAMPLES 1 TO 6

In Comparative Examples 1 to 3, the compositions were prepared in the same manner as in Examples 1 to 3 except that untreated Artificial Graphite KS-44 was used. Printed films were obtained therefrom in the same manner as above.

In Comparative Examples 4 to 6, the compositions were prepared in the same manner as in Examples 1 to 3, except that Nickel Particle #255 (a product of Inco Limited) was used. Printed films were obtained therefrom also in the same manner as above.

The results of Comparative Examples 1 to 6 are also shown in Table 1. The relationship between the filling rate of the electroconductive particles and the volume resistivity in these examples and comparative examples are shown in the attached drawing.

It is apparent from Table 1 and the drawing that when the nickel-coated carbon of the present invention was used as the electroconductive particles, a volume resistivity far lower than that obtained by using ordinary graphite or nickel particles was obtained.

EXAMPLES 4 TO 9

100 parts by weight of the base compound obtained in Examples 1 to 3 was mixed with particles having an average particles size of 50 to 150 μm obtained by coating Artificial Graphite KS-44 with 75 percent by weight of nickel by a chemical plating process in an amount shown in Table 2. A solvent was added thereto to obtain a pasty electroconductive silicone elastomer composition (Examples 4–6).

Similarly, the base compound was mixed with particles having an average particle size of 50 to 150 μm obtained by coating Artificial Graphite KS-44 with 85 percent by weight of nickel by a chemical plating process in an amount shown in Table 2. A solvent was added thereto to obtain a pasty electroconductive silicone elastomer composition (Examples 7 to 9).

The printing was made using the compositions obtained as above in the same manner as in Examples 1 to 3. The volume resistivity of the film is shown in Table 2.

The relationships between the filling rate of the electroconductive particles and the volume resistivity in Examples 4 to 9 are shown in the drawing.

TABLE 2

|  | Example | | | | | |
|---|---|---|---|---|---|---|
|  | 4 | 5 | 6 | 7 | 8 | 9 |
| Base compound | 100 | 100 | 100 | 100 | 100 | 100 |
| 75 wt. % Ni-coated graphite | 100 | 150 | 300 | — | — | — |
| 85 wt. % Ni-coated graphite | — | — | — | 100 | 150 | 300 |
| Solvent | 2 | 5 | 5 | 2 | 5 | 5 |
| Volume resistivity (Ω · cm) | $3 \times 10^{-1}$ | $2 \times 10^{-2}$ | $8 \times 10^{-3}$ | $1 \times 10^{2}$ | $3 \times 10^{-1}$ | $3 \times 10^{-2}$ |

EXAMPLE 10

A mixture of 100 parts by weight of a polydiorganosiloxane comprising 99.8 molar percent of dimethylsiloxy units and 0.2 molar percent of methylvinylsiloxy units and endblocked by trimethylsiloxy units, and having an average degree of polymerization of 4,000, 5 parts by weight of fumed silica having its surface treated with polydimethylsiloxane and 1.0 part by weight of a silicone fluid comprising 30 molar percent diphenylsiloxy units and 70 molar percent dimethylsiloxy units and endblocked by methoxy groups as a processing aid was kneaded by an ordinary method to obtain a base compound.

The base compound was further mixed homogeneously with 300 parts by weight of particles having an average size of 50 to 100 μm obtained by coating Artificial Graphite KS-44 with 50 weight percent of nickel by the chemical coating process by means of a two-roll mill. The mixture was then thoroughly mixed with 50 ppm (in terms of platinum metal), based on the total weight, of a 1 weight percent solution of chloroplatinic acid in isopropanol, 2.0 weight percent of polymethylhydrogensiloxane having a viscosity of 21 cP at 25° C. and a Si-H content of 0.86 weight percent and 0.05 part by weight of methyl ethyl ketone peroxide as a reaction inhibitor to obtain an electroconductive silicone elastomer molding composition of the present invention.

TABLE 1

|  | Example | | | Comparative Example | | | | | |
|---|---|---|---|---|---|---|---|---|---|
|  | 1 | 2 | 3 | 1 | 2 | 3 | 4 | 5 | 6 |
| Base compound | 100 | 100 | 100 | 100 | 100 | 100 | 100 | 100 | 100 |
| 50 wt. % Ni—coated graphite | 100 | 150 | 300 | — | — | — | — | — | — |
| Artificial Graphite KS-44 | — | — | — | 100 | 150 | 300 | — | — | — |
| Nickel Particle #255 | — | — | — | — | — | — | 400 | 500 | 550 |
| Solvent | 2 | 5 | 5 | 5 | 10 | 20 | 10 | 20 | 20 |
| Volume resistivity (Ω · cm) | $2 \times 10^{-2}$ | $6 \times 10^{-3}$ | $5 \times 10^{-3}$ | $1 \times 10^{2}$ | $5 \times 10^{0}$ | $1 \times 10^{0}$ | $2 \times 10^{0}$ | $5 \times 10^{-2}$ | $3 \times 10^{-2}$ |

COMPARATIVE EXAMPLE 7

In Comparative Example 7, a molding composition was obtained in the same manner as in Example 10 except that the nickel-coated graphite was replaced with 500 parts by weight of Nickel Particle #255.

The molding compositions obtained as above were vulcanized at 170° C. under a pressure of 50 kg/cm$^2$ for 10 min. Mechanical properties and electroconductivity (volume resistivity, Ω.cm) of the products were examined to obtain the results shown in Table 3.

TABLE 3

|  | Example 10 | Comp. Ex. 7 |
|---|---|---|
| Hardness | 78 | 89 |
| Tensile strength (kg f/cm$^2$) | 27 | 10 |
| Elongation (%) | 130 | 50 |
| Tear strength (kg f/cm) | 8 | 7 |
| Specific gravity | 2.16 | 3.77 |
| Volume resistivity (Ω · cm) | $1.2 \times 10^{-1}$ | 5.8 |

The sheets vulcanized as above were treated at a given temperature for a given time as shown in Table 4 and then electroconductivity (volume resistivity, Ω.cm) thereof were examined to obtain the results shown in Table 4.

TABLE 4

|  |  | Time |  |  |  |  |  |
|---|---|---|---|---|---|---|---|
|  |  | Untreated | 1 h | 2 h | 4 h | 24 h | 168 h |
| 150° C. | Example 10 | $1.2 \times 10^{-1}$ | $6.8 \times 10^{-2}$ | $8.5 \times 10^{-2}$ | $5.6 \times 10^{-2}$ | $5.4 \times 10^{-2}$ | $5.9 \times 10^{-2}$ |
|  | Comp. Ex. 7 | 5.8 | 15.0 | $1 \times 10^3$ | ∞ | ∞ | ∞ |
| 200° C. | Example 10 | $1.2 \times 10^{-1}$ | $6.7 \times 10^{-2}$ | $6.3 \times 10^{-2}$ | $7.7 \times 10^{-2}$ | $1.2 \times 10^{-1}$ | $1.0 \times 10^{-1}$ |
|  | Comp. Ex. 7 | 5.8 | ∞ | ∞ | ∞ | ∞ | ∞ |

The sheets vulcanized as above were treated in a humidity controlled thermostat oven (60° C., 90% humidity) for the time shown in Table 5 and then electroconductivity (volume resistivity, Ω.cm) thereof were examined to obtain the results shown in Table 5.

TABLE 5

| Time | Untreated | 100 | 200 | 300 | 500 |
|---|---|---|---|---|---|
| Example 10 | $1.2 \times 10^{-1}$ | $8.0 \times 10^{-2}$ | $7.6 \times 10^{-2}$ | $8.5 \times 10^{-2}$ | $1.0 \times 10^{-1}$ |
| Comp. Ex. 7 | 5.8 | 10.5 | 15.0 | $1 \times 10^3$ | ∞ |

It is apparent from the above examples that the electroconductive silicone elastomer composition of the present invention has excellent electroconductivity which is substantially unchanged with time even at a high temperature and a high moisture resistance. The composition is usable, therefore, as a quite effective electric contact material or electromagnetic wave shielding material.

We claim:

1. An electroconductive silicone elastomer composition comprising:
   (A) 100 parts by weight of a polydiorganosiloxane having an average degree of polymerization of 500 to 12,000, wherein each polymer molecule contains at least two vinyl groups bonded to silicon atoms;
   (B) 100 to 500 parts by weight of nickel-coated carbon;
   (C) 0.1 to 5 parts by weight of a polyorganohydrogensiloxane, and
   (D) 0.2 to 300 ppm based on the total amount of (A), (B) and (C) of platinum metal or platinum compound as platinum atom.

2. An electroconductive silicone elastomer composition as in claim 1 wherein the organic groups bonded to the silicon atoms of polyorganosiloxane (A) are methyl or vinyl groups.

3. An electroconductive silicone elastomer composition as in claims 1 or 2 wherein the amount of nickel coating applied to the carbon in (B) is from 30 to 90 weight percent based on carbon.

4. An electroconductive silicone elastomer composition as in claim 1 wherein the nickel-coated carbon is carbon black, graphite or granulated carbon.

5. An electroconductive silicone elastomer composition as in claim 3 wherein the nickel-coated carbon has an average particle size of 10 to 100 μm.

6. An electroconductive silicone elastomer composition as in claim 1 wherein the amount of nickel-coated carbon present ranges from 250 to 400 parts by weight.

7. An electroconductive silicone elastomer composition as in claims 1 or 6 wherein at least three hydrogen atoms on average are bonded to silicon atoms in each of the polyorganohydrogensiloxane (C) molecules, and the number of hydrogen atoms bonded to silicon atoms ranges from 0.5 to 10 per vinyl group bonded to the silicon atoms in polydiorganosiloxane (A).

8. An electroconductive silicone elastomer composition as in claims 1, 2, 4 or 6, wherein there is present from 1 to 100 ppm platinum metal or platinum compound as platinum atom, based on the total amount of (A), (B) and (C).

* * * * *